United States Patent [19]

Hamilton et al.

[11] Patent Number: 5,582,235

[45] Date of Patent: Dec. 10, 1996

[54] TEMPERATURE REGULATOR FOR BURN-IN BOARD COMPONENTS

[75] Inventors: Harold E. Hamilton, Minneapolis; James R. Zimmer, Cologne, both of Minn.

[73] Assignee: Micro Control Company, Minneapolis, Minn.

[21] Appl. No.: 288,840

[22] Filed: Aug. 11, 1994

[51] Int. Cl.[6] .................................................. F25B 29/00
[52] U.S. Cl. .................... 165/263; 165/80.3; 324/760; 364/557
[58] Field of Search ...................... 324/760; 165/104.33, 165/80.3, 30; 364/557

[56] References Cited

U.S. PATENT DOCUMENTS

| | | | |
|---|---|---|---|
| 3,444,308 | 5/1969 | Narbut | 174/15 |
| 3,710,251 | 1/1973 | Hagge et al. | 324/158 F |
| 4,172,993 | 10/1979 | Leach | 324/158 F |
| 4,350,838 | 9/1982 | Harrold | 174/15 R |
| 4,688,180 | 8/1987 | Motomiya | 364/557 |
| 4,741,385 | 5/1988 | Bergles et al. | 165/1 |
| 4,750,086 | 6/1988 | Mittal | 361/382 |
| 4,787,752 | 11/1988 | Fraser et al. | 324/760 |
| 4,897,762 | 1/1990 | Daikoku et al. | 361/382 |
| 4,982,347 | 1/1991 | Rackerby et al. | 364/557 |
| 5,359,285 | 10/1994 | Hashinaga et al. | 165/80.3 |
| 5,413,164 | 5/1995 | Teshima et al. | 165/11.1 |
| 5,414,370 | 5/1995 | Hashinaga et al. | 324/760 |
| 5,464,284 | 11/1995 | Rall | 364/557 |

OTHER PUBLICATIONS

IBM Technical Disclosure Bulletin, vol. 27, No. 7B, Dec. 1984 "Burn–In Fixture for Modules" by R. Brzyski, E. Grenchus, Sr., M. Rathod and R. J. Stutzman.

"Cooling of a Multichip Electronic Module by Means of Confined Two–Dimensional Jets of Dielectric Liquid", The American Society of Mechanical Engineers; D. C. Wadsworth and I. Mudawart, pp. 79–87.

"Experimental Investigation of Single Phase Multi–Jet Impingement Cooling of an Array of Microelectronic Heat Sources" by L. M. Jiji and Z. Dagan, pp. 265–283.

*Primary Examiner*—Edward K. Look
*Assistant Examiner*—Mark Sgantzos
*Attorney, Agent, or Firm*—Westman, Champlin & Kelly, P.A.

[57] ABSTRACT

The present invention is directed to an apparatus suitable for regulating, with an impinging flow of gas, the temperature of an electronic component under thermal stress testing at selected temperatures. The apparatus comprises a sensor which senses the temperature of the electronic component and provides an electrical signal representative of sensed temperature to a controller. A gas flow regulator is used to control flow directed to impinge the flow of gas upon the electronic component as necessary to adjust the temperature. The gas flow regulator ms controlled by the controller which operates the regulator so as to adjust the temperature of the electronic components.

15 Claims, 2 Drawing Sheets

TEMPERATURE REGULATOR FOR BURN-IN BOARD COMPONENTS

BACKGROUND OF THE INVENTION

The present invention relates generally to devices controlling or conditioning the temperature of electronic components which are being stress tested in "burn-in" ovens, or the like, to determine characteristics of the electronic components. Specifically, the present invention relates to an apparatus that impinges a flow of gas on each electronic component to regulate the temperature of the electronic components in the burn-in oven.

Electronic components, such as silicon chip integrated circuits (ICs) or other semiconductor devices, are subject to early failure during their life cycle. Thus, producers of these electronic components have found it cost-effective to rigorously stress test electronic components prior to their inclusion in electronic products. By conducting such stress testing, and by the elimination of failed, under-performing electronic components in final test, the reliability of the electronic components that pass the stress test is greatly enhanced.

During such tests, or "burn-in", burn-in boards are used to support a number of electronic components inside an oven. Burn-in ovens are typically large enough to hold several racks of burn-in boards with each burn-in board holding several electronic components.

Within the oven, temperature gradients typically cause a variation in temperature across a burn-in board of approximately 20%. Also, there is hysteresis as the oven heating elements cycle on and off in order to maintain a selected temperature. While burn-in procedures have been generally acceptable to date, variations in temperature experienced by the electronic components have slowed testing and created inefficiencies. It is desirable to overcome temperature gradients within the oven so as to subject all of the electronic components to the selected temperature. Ideally, electronic components tested in burn-in ovens should be kept within a band of 2° C. at 150° C. for testing and stressing.

Current burn-in procedures for higher power devices include several problems. For example, the power of each component may vary by 30 percent. Also, thermal impedance may vary from one component to another by a second order effect. Present burn-in procedures often destroy higher power electronic components. Electronic component temperatures continue to vary even if the electronic components are bathed in a single stream of air.

For the foregoing reasons, there exists a need for a burn-in oven that provides electronic components inside the burn-in oven with a uniform, or individual, temperature that is cost-effective and subject to real-time adjustments during burn-in so as to efficiently test electronic components.

SUMMARY OF THE INVENTION

The present invention is directed to an apparatus suitable for regulating, with an impinging flow of gas, the temperature of an electronic component under thermal stress testing at selected temperatures. The apparatus comprises a sensor which senses the temperature of the electronic component and provides an electrical signal representative of sensed temperature to a gas flow controller. A gas flow regulator is used to control flow directed to impinge the flow of gas upon the electronic component as necessary to adjust the temperature. The gas flow regulator is controlled by the gas flow controller which operates the gas flow regulator so as to adjust the temperature of the electronic components.

DETAILED DESCRIPTION OF THE PREFERRED EMBODIMENTS

Figure 1:
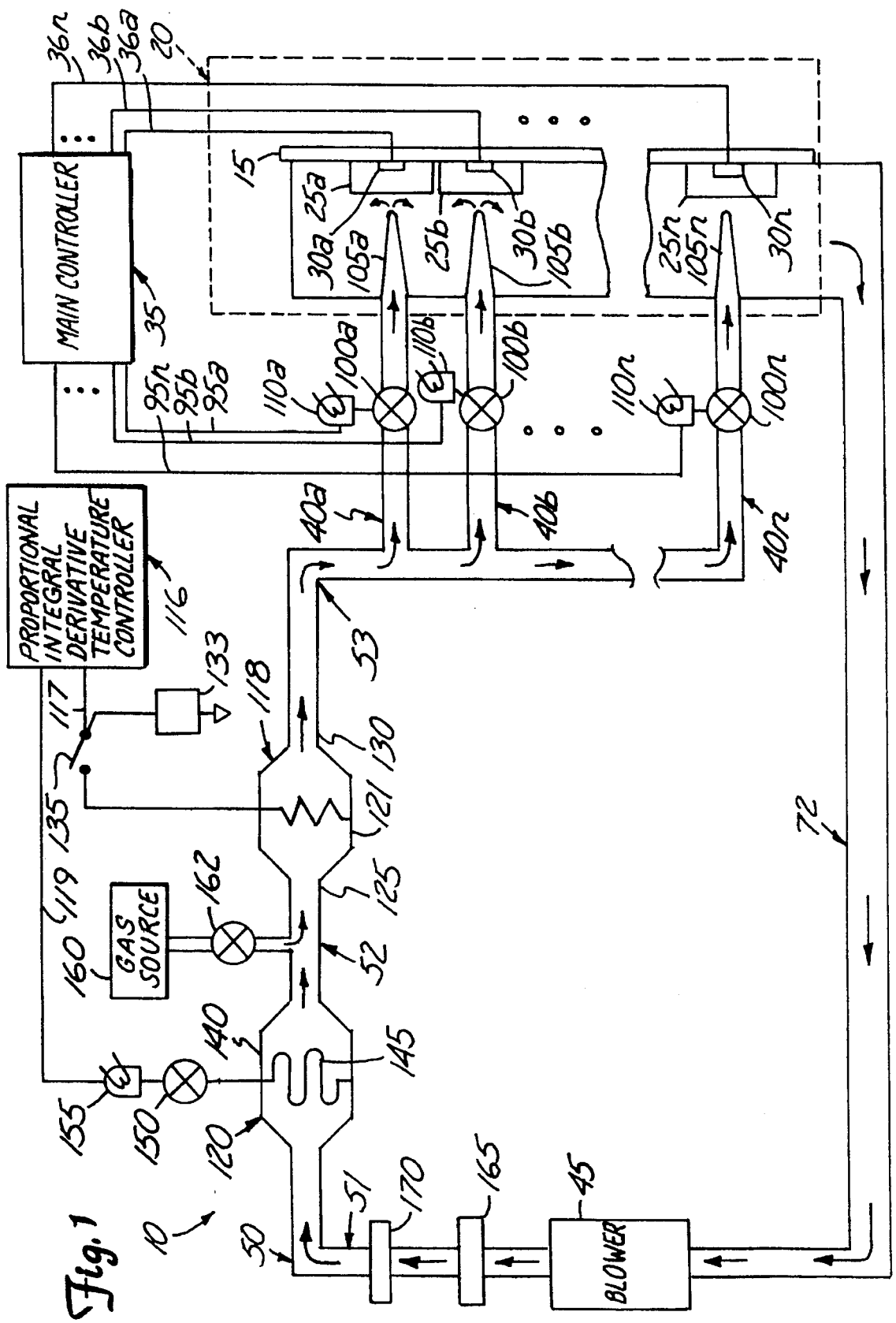
FIG. 1 is a schematic view of an apparatus of the present invention.

FIG. 1 shows an apparatus for regulating the temperature of electronic components under thermal stress testing at selected temperatures constructed in accordance with the present invention and indicated at 10. During stress testing, or "burn-in", a plurality of burn-in boards 15 are mounted in a burn-in oven 20, each burn-in board 15 typically carrying a multiplicity of electronic components 25a–25n. A thermal sensor 30a–30n preferably is attached to each electronic component 25a–25n, respectively, for indicating the temperature of each electronic component 25a–25n. Each thermal sensor 30a–30n provides an electrical signal, which is representative of the temperature of the corresponding electronic components 25a–25n, to a microprocessor based gas flow controller 35 along leads 36a–36n, respectively. The gas flow controller 35 controls a flow of impinging gas upon each electronic component 25a–25n in response to the temperature signal from the thermal sensor 30a–30n. A plurality of nozzle assemblies 40a–40n, mounted adjacent to the electronic components 25a–25n, serve to direct an individual flow of gas onto each electronic component 25a–25n.

A blower 45 provides a gas flow to the nozzle assemblies 40a–40n through a gas flow conduit 50 having an inlet conduit 51, an intermediate conduit 52, and an output conduit 53. Output conduit 53 is connected to the nozzle assemblies 40a–40n. Preferably, a recirculating conduit 72 carries exhaust gas from the oven 20 back to the inlet of blower 45.

Each nozzle assembly 40a–40n comprises a nozzle valve 100a–100n, a nozzle 105a–105n, and a nozzle controller 110a–110n, respectively. The nozzle controllers 110a–110n are connected by leads 95a–95n to gas flow controller 35 and control gas flow from conduit 50 through the respective nozzle valves 100a–100n in response to signals from main controller 35. The nozzle controllers 110a–110n can include a solenoid, a stepper motor, or the like. The nozzles 105a–105n, are connected to receive gas flow from nozzle valves 100a–100n. The nozzles 105a–105n are proximate the electronic components 25a–25n so as to direct the flow of impinging gas upon the electronic components 25a–25n, respectively. The nozzles 105a–105n preferably are adjustably positionable so that the outlets of nozzles 105a–105n are directly adjacent to the respective electronic components 25a–25n.

Figure 2:
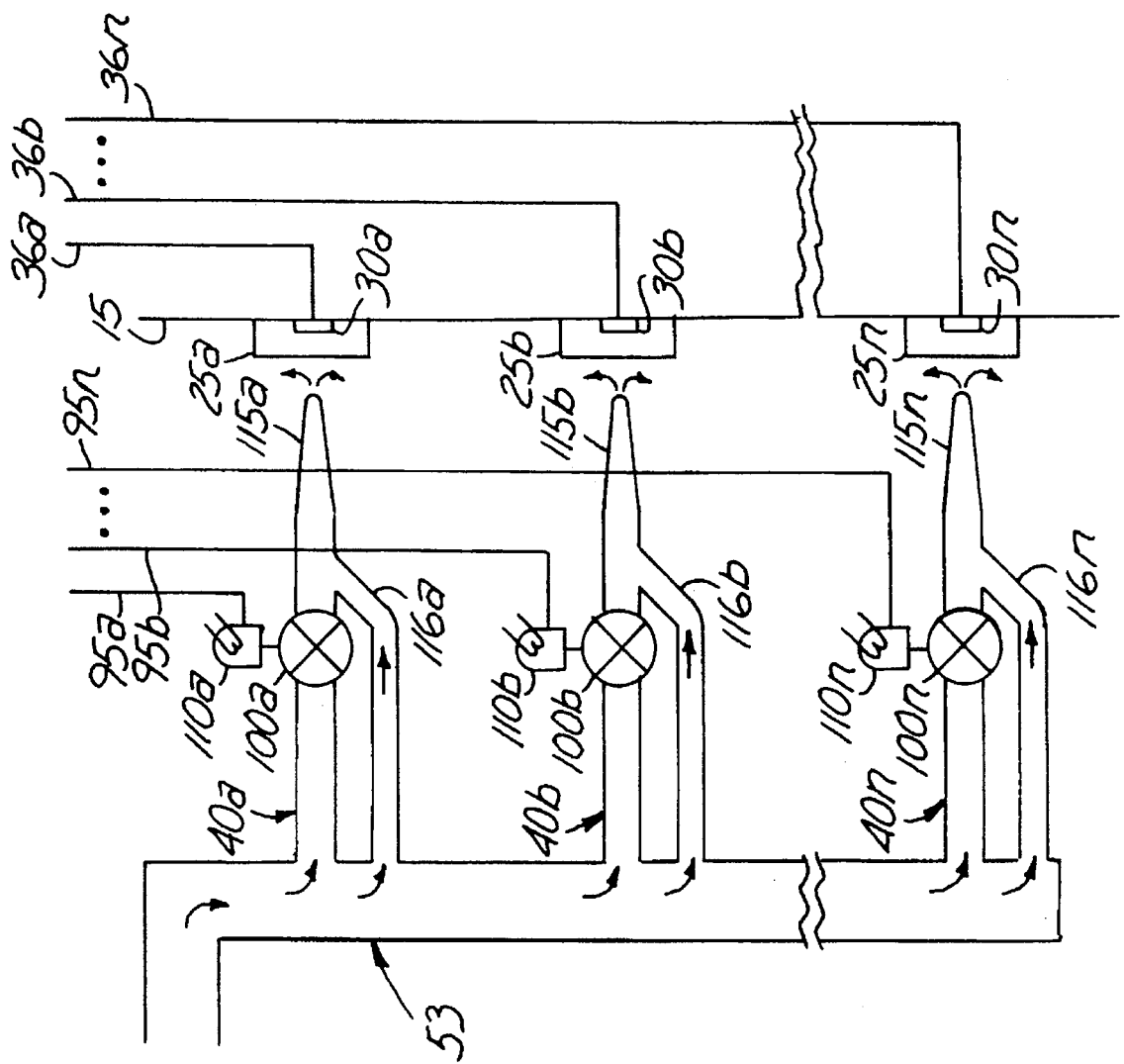
FIG. 2 is a more detailed schematic view of another embodiment of the present invention.

Alternatively, as shown in FIG. 2, each nozzle assembly 40a–40n comprises a nozzle valve 100a–100n, a nozzle controller 110a–110n, a nozzle 115a–115n and an intake 116a–116n. The nozzle valve 100a–100n and nozzle controller 110a–110n is not connected to the intake 116a–116n in the nozzle assembly 40a–40n, respectively. Thus, gas constantly flows through nozzles 115a–115n. Such a configuration provides a constant flow of gas with regulated volume. The advantage of this configuration is the ability to regulate the temperature of the electronic components 25a–25n without constantly operating the nozzle valves and nozzle controllers. This reduces mechanical wear, dampens temperature fluctuation, and preserves the life of such parts.

Referring back to FIG. 1, in order to get an accurate temperature reading for the electronic components 25a–25n, the thermal sensors 30a–30n are preferably affixed to the electronic components 25a–25n, respectively. It is understood, however, alternatives to affixing the thermal sensors 30a–30n to the electronic components 25a–25n are contemplated. Such alternatives may include making thermal sensors an integral part of the electronic components 25a–25n. Also, temperatures of the electronic components 25a–25n may be obtained from a remote location such as subjecting each electronic component to an infrared temperature sensor.

A temperature controller 116 is connected by heater lead 117 to control operation of a heater 118, and a cooler lead 119 to control operation of a cooler 120. The heater 118 and cooler 120 are located in the intermediate conduit 52 of flow conduit 50. The temperature controller 116 maintains the temperature of the gas impinging on the electronic components at a desired level.

The heater 118 includes a high wattage density heater 121, such as a commercially available nickel-chrome filament enclosed in a quartz envelope. The gas flows from input port 125, across the heater 118 and discharges through hot gas port 130. The high wattage density heater 118 has a low mass and is capable of attaining temperatures as high as 1000° C. in several seconds. This results in rapid heating of the air passing therethrough. Thus, with a short length of the gas flow conduit 50 downstream of the heater 118, almost instantaneous bathing of the electronic components 25a–25n in gas of the desired high temperature. High wattage density heater 121 is supplied with electrical power from a source 133 through a heater switch 135 and the heater lead 117. The heater switch 135 is controlled by the temperature controller 116.

The cooler 120 preferably comprises a mechanical cooling coil 145. A gas or liquid flows through the cooling coil 145. The cooling coil 145 is controlled by a cooling valve 150 actuated by a cooling solenoid 155, or the like. The temperature controller 116 controls the cooling solenoid 155 by means of the cooler lead 119.

The temperature controller 116 as shown comprises a commercially available proportional integral derivative (PID) temperature controller that senses the rate of change of temperature and adjusts the amount of power applied to the heater 118 or cooler 120. The temperature controller 116 is programmed to avoid overshooting the desired temperature.

Preferably, the heater 118 and cooler 120 are both in the gas flow conduit 50. It is understood, however, that alternatives are contemplated, such as the heater 118 and cooler 120 working in parallel and sharing an inlet conduit 51 and output conduit 53. Also, the heater 118 can be downstream from the cooler 120, as well as upstream. The particular details of the cooler 125 (including the cooling coil 145) can be modified as desired, and can include a water coil, a refrigeration system with an evaporation coil, or liquid nitrogen. Further, the heater 118 can use any desired heating element or heating source.

A compressed gas source 160 can be used to discharge gas into the gas flow conduit 50 through a valve 162. The gas can comprise nitrogen, air, a specific mixture of the two, or any other preferably inert gas. The gas used preferably should not oxidize the electronic components 25a–25n. For example, air will not oxidize components 25a–25n at room temperature, but air will oxidize components 25a–25n at 125° C. It is understood that the gas may enter the gas flow path of apparatus 10 through any point. Additionally, a filter 165 and a dryer 170 can be used to clean and dry the gas in the conduit 50.

In operation, the gas flow controller 35 analyzes information obtained from each thermal sensor 30a–30n and automatically effects gas flow rates in the apparatus 10. The gas flow controller 35 controls the flow of the gas for each component 25a–25n based on an analysis of feedback from the thermal sensors 30a–30n, respectively. Because the electronic components are mounted adjacent each other, the gas temperature and the volume needed to keep the components near the desired temperature can be calculated and maintained.

The gas temperature usually can be maintained at a level that accommodates a trend in temperature drift of the electronic components 25a–25n. The overall oven temperature is controlled within a range, and the controller 35 gets signals indicating whether the electronic components 25a–25n are either too cool or too hot. The gas flow then is adjusted at each independent nozzle. The individual component 25a–25n temperature drifts are corrected by controlling the volume of gas directly impinging on the component by controlling the respective valve 100a–100n adjacent the component 25a–25n.

Although the present invention has been described with reference to preferred embodiments, workers skilled in the art will recognize that changes may be made in form and detail without departing from the spirit and scope of the invention.

What is claimed is:

1. An apparatus for regulating with an impinging flow of gas from a source the temperature of an electronic component under thermal stress testing at selected temperatures, the apparatus comprising:

sensing means operably connected to the electronic component for providing a signal representative of the temperature of the electronic component;

regulating means proximate the electronic component for regulating the flow of gas impinging upon the electronic component;

control means operably connected to the sensing means and the regulating means for receiving the signal from the sensing means and adjusting the temperature of the electronic component with the regulating means so that the temperature of the electronic component is maintained at a selected temperature range;

temperature conditioning means operably connected to the regulating means for affecting the temperature of the gas;

a blower; and a gas path flow conduit having an inlet conduit, the blower connected to the inlet conduit, an intermediate conduit, the temperature conditioning means connected to the intermediate conduit, and an output conduit, the regulating means connected to the output conduit such that the gas flows through the gas path flow conduit from the blower into the temperature conditioning means and out of the regulating means.

2. The apparatus of claim 1 wherein the regulating means provides a substantially constant flow of gas with regulated volume.

3. The apparatus of claim 1 wherein the regulating means comprises:

nozzle means proximate the electronic component for directing the flow of gas onto the electronic component;

valve means attached to the nozzle means for controlling the flow of gas through the nozzle means; and valve control means operably connected to the valve means and the control means for operating the valve means.

4. The apparatus of claim 1 wherein the regulating means comprises:

a nozzle proximate the electronic component;

one of a stepper motor and a solenoid operably connected to the control means;

and a valve actuated by the one of the stepper motor and the solenoid for controlling flow to the nozzle.

5. The apparatus of claim 1 and further comprising temperature control means operably connected to the temperature conditioning means for adjusting the temperature of the gas with the temperature conditioning means.

6. The apparatus of claim 1 wherein the temperature conditioning means comprises means for cooling the gas and means for heating the gas.

7. The apparatus of claim 6 wherein the cooling means comprises a mechanical cooling coil.

8. The apparatus of claim 6 wherein the heating means comprises a high watt density heater.

9. The apparatus of claim 1 and further comprising a recirculating conduit proximate the electronic component and connected to the blower such that the gas is collected after it is applied to the electronic component and returned to the blower through the recirculating conduit.

10. The apparatus of claim 1 wherein the sensing means is affixed to the electronic component.

11. An apparatus suitable for regulating with an impinging flow of gas the temperature of an electronic component under thermal stress testing at selected temperatures, the apparatus receiving the gas from a source, and the apparatus comprising:

a nozzle assembly for applying the impinging flow of gas to the electronic component, the nozzle assembly having:

a nozzle proximate the electronic component;

one of a stepper motor and a solenoid; and a valve attached to the nozzle and actuated by the one of the stepper motor and the solenoid;

sensing means thermally connected to the electronic component for providing a signal representative of the temperature of the electronic component;

control means operably connected to the sensing means and the solenoid for receiving the signal from the sensing means and correspondingly adjusting the temperature of the electronic component with the nozzle assembly to regulate the impinging flow of gas;

a blower;

a gas path flow conduit having an inlet conduit, the blower connected to the inlet conduit, an intermediate conduit, the temperature conditioning means connected to the intermediate conduit, and a output conduit, the regulating means connected to the output conduit such that the gas flows through the gas path flow conduit from the blower into the temperature conditioning means and out of the regulating means; and a recirculating conduit proximate the electronic component and connected to the blower such that the gas is collected after it is applied to the electronic component and returned to the blower through the recirculating conduit.

12. The apparatus of claim 11 wherein the sensing means is a thermal sensor affixed to the electronic component.

13. The apparatus of claim 11 wherein the nozzle assembly further comprises means for providing a constant flow of gas such that the nozzle assembly regulates gas volume.

14. The apparatus of claim 11 and further comprising temperature conditioning means operably connected to the source for affecting the temperature of the gas.

15. An apparatus suitable for individually regulating with an impinging flow of gas the temperatures of a plurality of electronic components under thermal stress testing at selected temperatures, the apparatus comprising:

a blower;

a cooler operably connected to the blower and having:

a cooling solenoid; and an evaporation coil actuated by the cooling solenoid;

a heating system operably connected to the blower and having:

a heating switch; and a high watt density heater actuated by the heater switch;

a plurality of nozzle assemblies, each nozzle assembly corresponding with at least one electronic component;

each nozzle assembly having:

a nozzle proximate the electronic component;

one of a nozzle solenoid and a stepper motor; and a valve connected to control flow to the nozzle and actuated by one of the nozzle solenoid and the stepper motor;

a plurality of thermal sensing means, each thermal sensing means for sensing the temperature of the electronic component and providing an electrical signal representative of the temperature;

control means operably connected to the nozzle solenoids and the thermal sensing means for receiving a signal from the thermal sensing means and correspondingly and independently adjusting the temperature of the electronic component using the nozzle assemblies to regulate the flow of gas upon each electronic component;

a gas path flow conduit connected to the blower, the cooler, the heating system, and the nozzle assemblies such that the flow of gas travels from the blower through the cooler and heating system, and to the nozzle assemblies to impinge upon the electronic component;

and a recirculating conduit for collecting gas impinged upon the electronic component and directing the gas to the blower.

* * * * *